United States Patent
Zhang et al.

(10) Patent No.: US 12,471,298 B2
(45) Date of Patent: Nov. 11, 2025

(54) FERROELECTRIC NON-VOLATILE MEMORY DEVICES

(71) Applicant: TetraMem Inc., Fremont, CA (US)

(72) Inventors: Minxian Zhang, Amherst, MA (US); Ning Ge, Danville, CA (US)

(73) Assignee: TetraMem Inc., San Jose, CA (US)

( * ) Notice: Subject to any disclaimer, the term of this patent is extended or adjusted under 35 U.S.C. 154(b) by 434 days.

(21) Appl. No.: 17/804,194

(22) Filed: May 26, 2022

(65) Prior Publication Data
US 2023/0402496 A1    Dec. 14, 2023

(51) Int. Cl.
*H10D 1/68* (2025.01)
*H10B 53/30* (2023.01)

(52) U.S. Cl.
CPC ............... *H10D 1/68* (2025.01); *H10D 1/682* (2025.01); *H10B 53/30* (2023.02)

(58) Field of Classification Search
None
See application file for complete search history.

(56) References Cited

U.S. PATENT DOCUMENTS

| | | | |
|---|---|---|---|
| 7,867,786 B2 * | 1/2011 | Ma | C30B 29/32 257/295 |
| 2020/0105772 A1 * | 4/2020 | Chen | H01L 28/60 |

FOREIGN PATENT DOCUMENTS

| | | | |
|---|---|---|---|
| CN | 101226956 A | * | 7/2008 |
| CN | 102005383 A | * | 4/2011 |

* cited by examiner

*Primary Examiner* — Michael Lebentritt
(74) *Attorney, Agent, or Firm* — Jaffery Watson Hamilton & DeSanctis LLP

(57) ABSTRACT

In accordance with some embodiments of the present disclosure, a memory device is provided. The memory may include a ferroelectric layer including a ferroelectric material interstitially doped with at least one interstitial dopant. The ferroelectric material may include a metal oxide. The interstitial dopant may include an element having an atomic radius that is not greater than an atomic radius of a metal element of the metal oxide. In some embodiments, the metal oxide comprises at least one of hafnium or zirconium. The memory device may be non-volatile. The memory device may be a ferroelectric capacitor (FeCAP), a ferroelectric field-effect transistor (FeFET), a ferroelectric tunneling junction (FTJ), and/or another form of ferroelectric random-access memory (Fe-RAM).

17 Claims, 7 Drawing Sheets

FERROELECTRIC NON-VOLATILE MEMORY DEVICES

TECHNICAL FIELD

The implementations of the disclosure relate generally to memory and computing devices and, more specifically, to ferroelectric non-volatile memory devices.

BACKGROUND

Ferroelectric materials may refer to materials that exhibit a spontaneous electric polarization that can be reversed in direction by the application of a suitable electric field, such as hafnium oxide ($HfO_2$), zirconium oxide ($ZrO_2$), zirconium-doped hafnium oxide ($Hf_{1-x}Zr_xO_2$), scandium-doped aluminum nitride ($Al_{1-x}Sc_xN$), titanates ($BaTiO_3$), niobates ($LiNbO_3$), tantalates ($NaTaO_3$), etc. The ferroelectric materials may remain polarized even when the electric field is removed. As such, the ferroelectric materials may store data when power is disconnected from them. This makes the ferroelectric materials promising candidates for implementing non-volatile memory that remains stored data even when its external power supply is disconnected.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

According to one or more aspects of the present disclosure, a memory device is provided. The memory device may include a ferroelectric layer including a ferroelectric material interstitially doped with at least one interstitial dopant. The ferroelectric material may include a metal oxide. The interstitial dopant may include an element having an atomic radius that is not greater than the atomic radius of a metal element of the metal oxide.

In some embodiments, the metal oxide comprises at least one of hafnium or zirconium.

In some embodiments, the metal oxide comprises at least one of hafnium oxide ($HfO_2$), zirconium oxide ($ZrO_2$), zirconium-doped hafnium oxide ($Hf_{1-x}Zr_xO_2$), scandium-doped aluminum nitride ($Al_{1-x}Sc_xN$), titanates ($BaTiO_3$), niobates ($LiNbO_3$), or tantalates ($NaTaO_3$).

In some embodiments, the interstitial dopant comprises at least one of H, N, C, B, or F.

In some embodiments, a dopant concentration of the interstitial dopant is not greater than 10 percent.

In some embodiments, the ferroelectric layer includes a monocrystalline film of the ferroelectric material.

In some embodiments, the ferroelectric layer comprises a polycrystalline film of the ferroelectric material or an amorphous film with short-range orders of the ferroelectric material.

In some embodiments, the ferroelectric layer includes a plurality of ferroelectric domains, wherein each of the ferroelectric domains exhibits two polarization states.

In some embodiments, a dimension (e.g., a lateral dimension) of the ferroelectric layer and/or a dimension of the memory device is not greater than 300 nm.

In some embodiments, a dimension of the ferroelectric layer and/or a dimension of the memory device is not greater than 100 nm.

In some embodiments, the dimension of the ferroelectric layer and/or the dimension of the memory device is not greater than 50 nm.

In some embodiments, the dimension of the ferroelectric layer and/or the dimension of the memory device is not greater than 30 nm.

In some embodiments, the dimension of the ferroelectric layer and/or the dimension of the memory device is not greater than 20 nm.

In some embodiments, the dimension of the ferroelectric layer and/or the dimension of the memory device is not greater than 10 nm.

In some embodiments, the dimension of the ferroelectric layer and/or the dimension of the memory device is not greater than 5 nm.

In some embodiments, the dimension of the ferroelectric layer and/or the dimension of the memory device is not greater than 3 nm.

In some embodiments, the memory device further includes one or more conductive layers fabricated at either side of the ferroelectric material. Each of the conductive layers includes an electrically conductive material.

In some embodiments, the memory device is part of at least one of a ferroelectric capacitor (FeCAP), a ferroelectric field-effect transistor (FeFET), a ferroelectric tunneling junction (FTJ), or another form of ferroelectric random-access memory (Fe-RAM).

In some embodiments, the memory device is non-volatile.

According to one or more aspects of the present disclosure, a method for fabricating a memory device is provided. The method includes fabricating a ferroelectric film of a ferroelectric material; and interstitially doping the ferroelectric film with at least one interstitial dopant, wherein the ferroelectric material comprises a metal oxide, and wherein the interstitial dopant comprises an element having an atomic radius that is not greater than an atomic radius of a metal element of the metal oxide.

In some embodiments, fabricating the ferroelectric film of the ferroelectric material includes fabricating a monocrystalline film of the ferroelectric material.

In some embodiments, fabricating the ferroelectric film of the ferroelectric material includes fabricating a polycrystalline film of the ferroelectric material or fabricating an amorphous film of the ferroelectric material. The amorphous film of the ferroelectric material includes the ferroelectric material having a short-range order.

In some embodiments, the ferroelectric film is fabricated utilizing at least one of an atomic layer deposition (ALD) technique, a chemical vapor deposition (CVD) technique, a metal organic chemical vapor deposition (MOCVD) technique, a physical vapor deposition (PVD) technique, or a molecular beam epitaxy (MBE) deposition technique.

In some embodiments, the ferroelectric film is interstitially doped using at least one of an ion implantation method, a co-sputtering method, a thermal diffusion method, an alternating sputtering method, or a chemical absorption method.

In some embodiments, the method further includes fabricating one or more conductive layers.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

DETAILED DESCRIPTION

Figure 1:
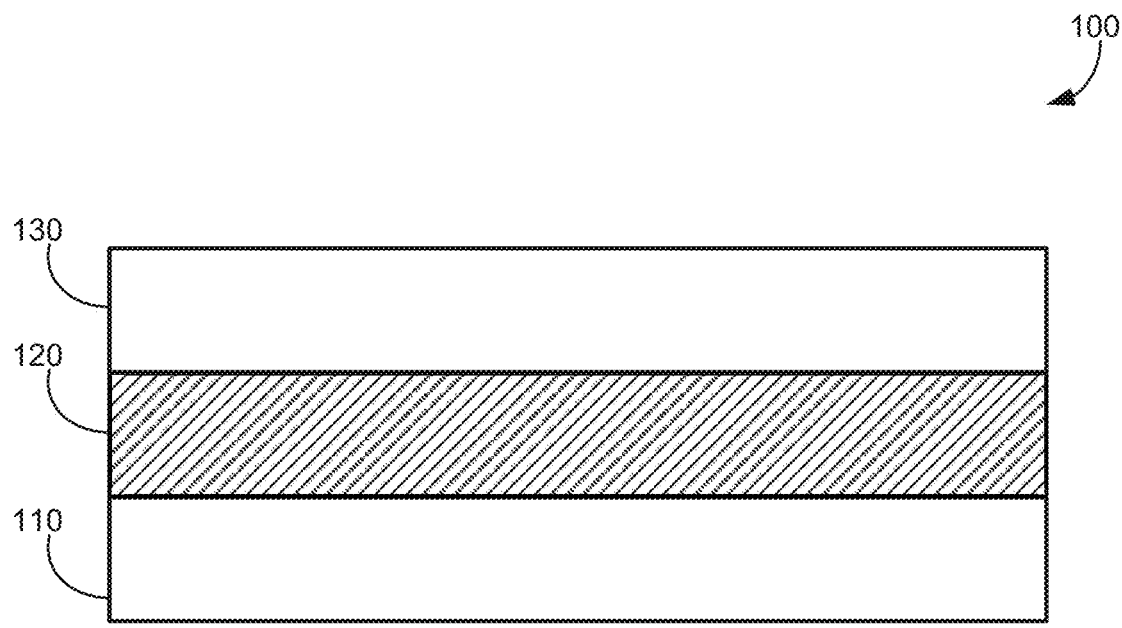
FIG. 1 is a cross-sectional view of an example of a memory device in accordance with some embodiments of the present disclosure.

Aspects of the present disclosure provide ferroelectric memory devices and methods for making the same. The ferroelectric memory devices may be part of ferroelectric random-access memories (Fe-RAM), such as a capacitor (e.g., ferroelectric capacitor (FeCAP)), a transistor (e.g., ferroelectric field-effect transistor (FeFET)), a ferroelectric tunneling junction (FTJ), etc.

A ferroelectric material may be polarized in response to the application of an external electric field and may remain polarized even when the external electric field is removed. The reversible spontaneous polarization arises from non-centrosymmetric arrangements of ions in the ferroelectric material that produce a permanent electric dipole moment. Adjacent dipoles tend to orient themselves in the same direction to form a region referred to as a ferroelectric domain.

A material may have multiple polymorphs of varying ferroelectric properties. For example, $HfO_2$ may exhibit a monoclinic phase (m-phase) between room temperature and 1,670° C. As the temperature increases, $HfO_2$ may undergo a phase transition from monoclinic to tetragonal (t-phase) and then to cubic (c-phase). $HfO_2$ does not exhibit ferroelectricity in the m-phase, the t-phase, or the c-phase. $HfO_2$ may exhibit ferroelectricity in a polar orthorhombic phase (o-phase). Although the m-$HfO_2$ phase is the most stable phase thermodynamically, the o-$HfO_2$ phase shows distinctive properties due to its intrinsic ferroelectric behavior. Therefore, doping $HfO_2$ to enhance the formation of o-$HfO_2$ phase and/or to reduce the o-$HfO_2$ polycrystal domain sizes may be desirable.

The ferroelectricity of a material relates to the permanent electrical polarization of a crystalline dielectric in an electric field. Ferroelectric materials exhibit bi-state polarization states, which can be used to store binary information of "0" and "1" in a non-volatile manner and enable memory devices. However, conventional ferroelectric memory devices typically suffer from limited scalability and cannot be used to implement applications that require more than two memory states (e.g., memory or synapses of a neural network). In particular, ferroelectric switching occurs by flipping or reversing the ferroelectric polarization of each ferroelectric domain (a volume of oriented spontaneous polarization). The size of the ferroelectric domain typically relates to the grain size of the ferroelectric material. The switching of each ferroelectric domain is binary between one of two stable states, corresponding to two polarization directions. Scaling down a conventional ferroelectric memory device may cause the memory device to be scaled to the normal grain size of the ferroelectric material in the ferroelectric memory device. As a result, the scaled-down conventional ferroelectric memory device may have only one grain with one ferroelectric domain and may thus only have two stable polarization states that may not be used to implement applications requiring three or more memory states.

The present disclosure provides for ferroelectric memory devices incorporating interstitially doped ferroelectric materials. In accordance with some embodiments of the present disclosure, a memory device may include a ferroelectric layer including an interstitially doped ferroelectric material. For example, the ferroelectric layer may include a metal oxide of Hf and/or Zr (e.g., $HfO_2$, $ZrO_2$, $Hf_{1-x}Zr_xO_2$ (or HZO), etc.) doped with an interstitial dopant that occupies the vacant space or interstitial site between the atoms of the metal oxide. The interstitial dopant may include an element having an atomic radius that is not greater than the atomic radius of Hf or the atomic radius of Zr, such as H, N, C, B, or F.

The introduction of the interstitial dopant may enhance the formation of the ferroelectric orthorhombic phase (o-phase) and suppress the formation of the non-ferroelectric monoclinic phase (m-phase) of the ferroelectric material, resulting in substantially enhanced remnant polarization of the ferroelectric material. The introduction of the interstitial dopant may also reduce the ion motion induced by internal or external thermal fluctuations, which may greatly enhance the thermal stability during switching cycles and ferroelectricity retention after switching. The ferroelectric memory devices described herein may exhibit higher endurance than conventional ferroelectric memory devices.

Furthermore, the introduction of the interstitial dopant may reduce the grain sizes of the ferroelectric material. For example, it may be desirable to reduce the grain sizes to about 1 nm such that when the device is scaled down to 3 nm by 3 nm by 3 nm (27 $nm^3$ in volume), there still may be a sufficient number of domains to exhibit tens of memory states. The interstitial dopants may reduce the energy barrier for the formation of the o-$HfO_2$. For example, the interstitial dopants may act as the nuclei for the heterogeneous nucleation of the o-$HfO_2$ phase to reduce the nucleation energy barrier, to promote the formation of polycrystalline o-$HfO_2$ phase, and to reduce the grain sizes of o-$HfO_2$ phases, etc. As a result, the interstitially doped ferroelectric material may have multiple ferroelectric domains corresponding to multiple stable states even when the memory device described herein is scaled down. As such, the interstitially doped ferroelectric material may be used to implement high-density memory applications.

FIG. 1 is a cross-sectional view of an example 100 of a memory device in accordance with some embodiments of the present disclosure. As shown, memory device 100 may include a first conductive layer 110, a ferroelectric layer 120, and a second conductive layer 130. The memory device 100 may be part of a capacitor (e.g., FeCAP), a transistor (e.g., FeFET), an FTJ, Fe-RAM, and/or any other form of ferroelectric memory.

Each of the first conductive layer 110 and the second conductive layer 130 may include a layer of any suitable electrically conductive material, such as W, Si, Ti, Ta, TiN, TaN, and noble metals such as Pt, Pd, Jr, etc. The first conductive layer 110 and the second conductive layer 130 may or may not include the same material. In some embodiments, the first conductive layer 110 and/or the second conductive layer 130 may include an electrode.

The ferroelectric layer 120 may include one or more layers of one or more ferroelectric materials. The ferroelectric materials may include, for example, a metal oxide doped with one or more substitutional and/or interstitial dopants. For example, the oxide $HfO_2$ may have a lattice composed of two sublattices, i.e., a sublattice occupied by metal atoms only and one sublattice occupied by oxygen atoms only. When the Hf atoms in the metal sublattice are substitutionally replaced by Zr atoms, $HfO_2$ becomes $(Hf_{1-x}Zr_x)O_2$, where x is the fraction of Hf being replaced by Zr, while the oxygen atoms in the oxygen sublattice are not affected. The atoms of the interstitial dopants may occupy the existing empty spaces between lattice atoms of the metal oxide, not necessarily between the atoms from one sublattice. Examples of the CMOS (complementary metal-oxide semiconductor) compatible ferroelectric metal oxide include transition metal oxides such as $HfO_2$, $ZrO_2$, $Hf_{1-x}Zr_xO_2$, $Al_{1-x}Sc_xN$, etc. The interstitial dopants may include any suitable dopant that may be used to interstitially dope the metal oxide. For example, the interstitial dopants may include an element having an atomic radius smaller than the atomic radius of the metal element (e.g., Hf, Zr, etc.) of the metal oxide. In some embodiments, the interstitial dopants include a nonmetal element of a suitable size, such as H, N, C, B, F, etc.

Figure 2C:
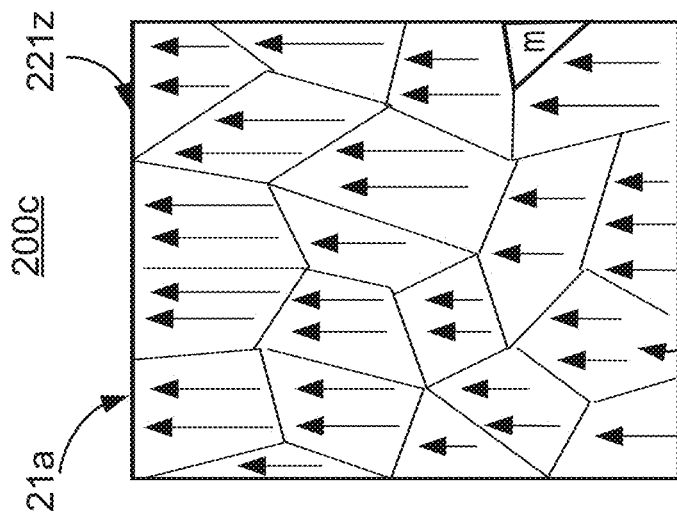
FIGS. 2A, 2B, and 2C illustrate ferroelectric domains of example ferroelectric materials in accordance with some embodiments of the present disclosure.
Figure 2B:
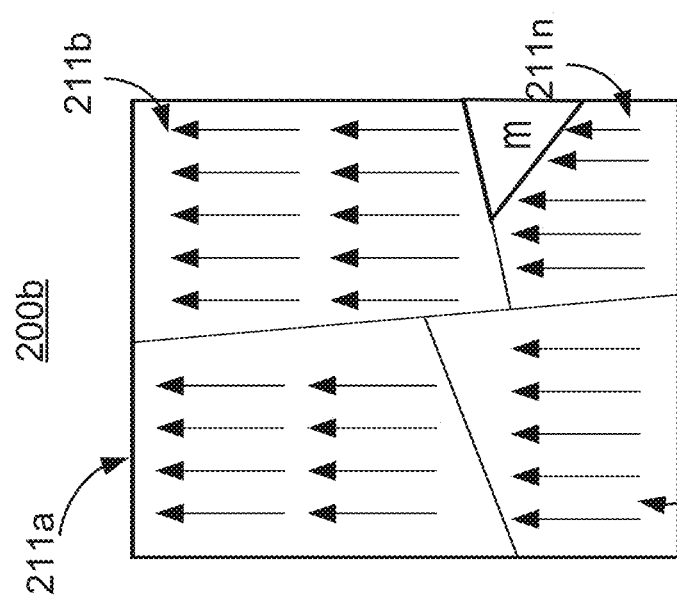
Figure 2A:
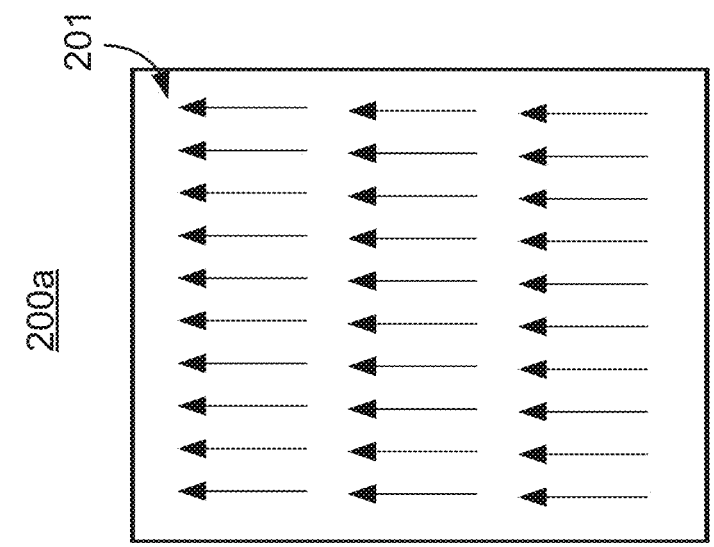

In some implementations, the ferroelectric layer 120 may include a monocrystalline film of the metal oxide. As shown in FIG. 2A, the monocrystalline film 200a may have a single ferroelectric domain 201 and may exhibit two polarization states (i.e., an upward polarization state or a downward polarization state). As such, the monocrystalline film may be used to implement two memory states.

In some implementations, the ferroelectric layer 120 may include a polycrystalline film and/or an amorphous film with short-range orders of the metal oxide. In such implementations, as shown in FIG. 2B, the polycrystalline and/or amorphous film 200b may have multiple ferroelectric domains 211a, 211b, 211c, 211n, etc., where each grain of the film is a single ferroelectric domain. Each of the ferroelectric domains 211a-n may exhibit two polarization states that may be used to implement two memory states. The film may be a complete polycrystal film but may exhibit some grains with non-ferroelectric materials such as m-$HfO_2$. The presence of some non-ferroelectric grains (marked by m) in the film may reduce the polarization intensity of the film. The introduction of the interstitial dopant(s) may promote the formation of the ferroelectric o-phase and reduce the grain size of the ferroelectric material. This may be because the growth of the ferroelectric grains will end at the grain boundaries where the grains encounter each other. Therefore, the more heterogeneous nucleations enhanced by the interstitial dopants, the finer the domain sizes of the ferroelectric films may be. As shown in FIG. 2C, the interstitially doped ferroelectric materials 200c as described herein may have multiple relatively small ferroelectric domains 221a, 221b, . . . , 221z, which may correspond to multiple stable polarization states even when the memory device described herein is scaled down (e.g., when the ferroelectric layer 120 and/or the memory device 100 has a dimension (e.g., a diameter, a lateral dimension, etc.) of 300 nm, 100 nm, 50 nm, 30 nm, 20 nm, 10 nm, 5 nm, 3 nm, etc.). The presence of non-ferroelectric materials, such as m-$HfO_2$, may also be reduced in the interstitially doped ferroelectric films to enhance the polarization intensities of the ferroelectric films. For example, with more ferroelectric domains in the ferroelectric film in the ferroelectric layer 120, it is possible to fully polarize some of the domains, and partially polarize some of the other domains with a controlled electric field. Therefore, the ferroelectric layer 120 may have ferroelectric domains 200c as shown in FIG. 3C and may be used to implement memory applications requiring more than two memory states and high-density memory applications. In some embodiments, the ferroelectric layer 120 and/or the memory device 100 has a dimension (e.g., a diameter, a thickness, a lateral dimension, etc.) that is not greater than 100 nm, 50 nm, 30 nm, 20 nm, 10 nm, 5 nm, 3 nm, etc. In some embodiments, a dimension (e.g., a lateral dimension) of the ferroelectric layer 120 and/or the memory device 100 is not greater than 300 nm.

Figure 3:
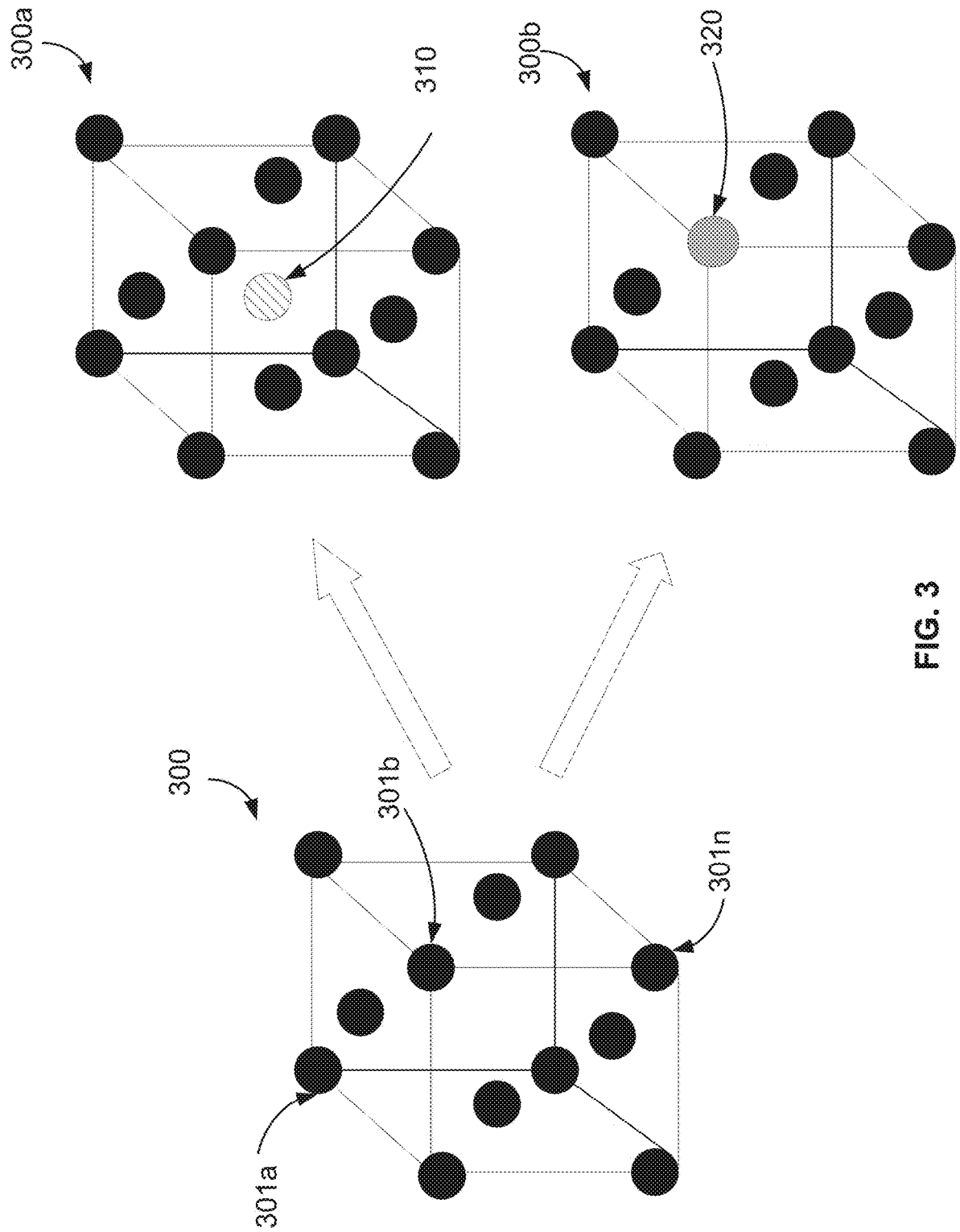
FIG. 3 illustrates example doping mechanisms in accordance with some embodiments of the present disclosure.

FIG. 3 illustrates example doping mechanisms for doping an example material 300 having a metal sublattice of an oxide with an orthorhombic structure in accordance with some embodiments of the present disclosure. As shown, the metal atoms of the material 300 may occupy the corners and face-center positions of a unit cell in the metal sublattice. The oxygen atoms in the oxygen sublattice are not affected and are not shown in FIG. 3 for simplicity. Interstitially doping the material 300 (e.g., a metal oxide) may involve doping the material 300 with an interstitial dopant 310 to form an interstitially doped material 300a. The metal atoms 301a, 301b, . . . , 301n of the material 300 form a lattice structure. The interstitial dopant 310 may occupy an interstitial site (i.e., an empty space or vacant space between the atoms 301a-n) of the material 300, or an empty space between the metal atoms 301a-n and the oxygen atoms (not shown). Since the selected interstitial dopants may have an atomic radius smaller than those of the metal atoms 301a-n or oxygen atoms, their presence in the oxide lattice may not generate substantial lattice distortions and may also readily migrate between interstitial sites. The interstitial dopant 310 does not replace any of the atoms 301a-n. In contrast, substitutional doping may involve doping the material 300 with a substitutional dopant 320 that may replace one or more atoms 301a-n to form a substitutionally doped material 300b. For example, the substitutional dopant 320 may include a Zr atom that may substitute for an Hf atom at a lattice point of the material 300 (i.e., the atom 301b).

Figure 4:
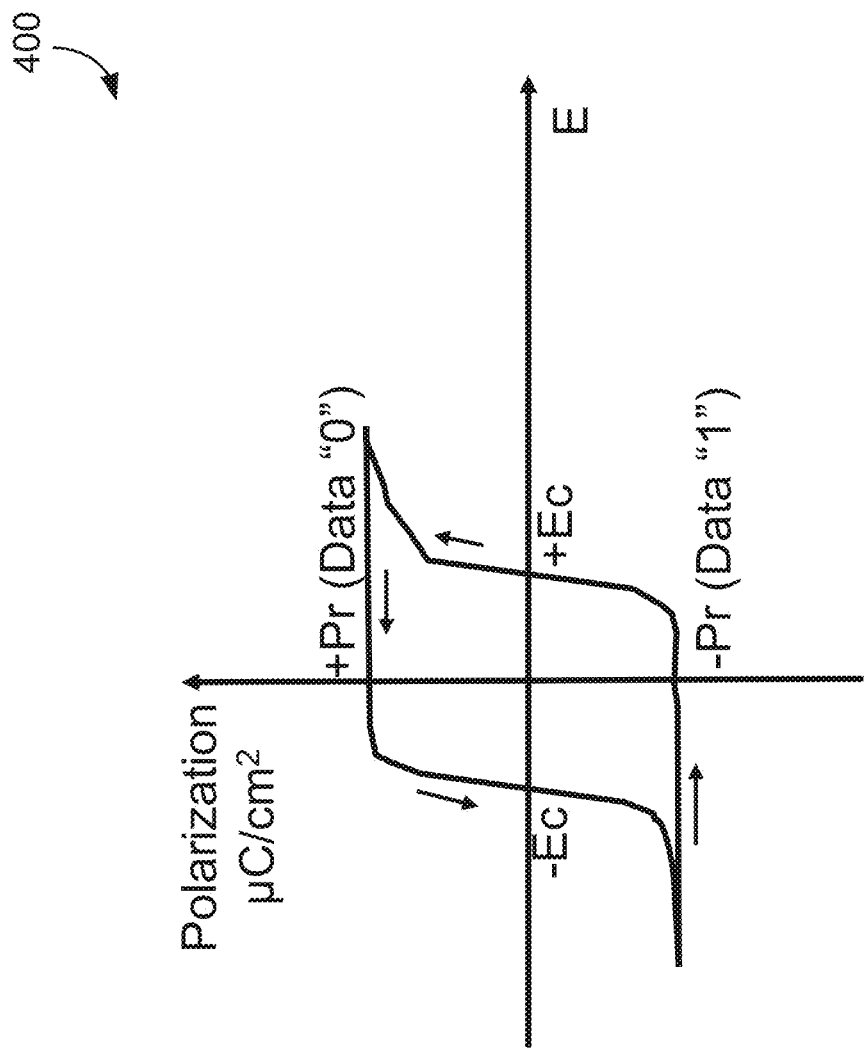
FIG. 4 is a schematic diagram showing a hysteresis loop for ferroelectric polarization of an example ferroelectric film under an electric field in accordance with some embodiments of the present disclosure

FIG. 4 is a schematic diagram showing a hysteresis loop 400 for ferroelectric polarization P of an example ferroelectric film under an electric field E in accordance with some embodiments of the present disclosure. Initially, the ferroelectric film may not exhibit any polarization (P=0 at E=0). As the electric field applied to the ferroelectric film increases, the polarization increases until it reaches saturation. As the electric field decreases to zero, the polarization decreases to +Pr at E=0. The polarization state +Pr can be used as a first non-volatile memory state (e.g., "0"). When the electric field is reversed, the polarization returns to zero at E=−Ec, with −Ec (or Ec) being the coercive field. As the electric field E increases in the reverse direction, the polarization may also saturate in the reverse direction. When the electric field returns to zero, the negative polarization returns to −Pr (the negative remnant polarization). The polarization −Pr may be used as a second non-volatile memory state (e.g., "1"). It is desirable to increase the magnitude of Pr for a wider memory window and to increase the magnitude of Ec for improved data retention.

Figure 5:
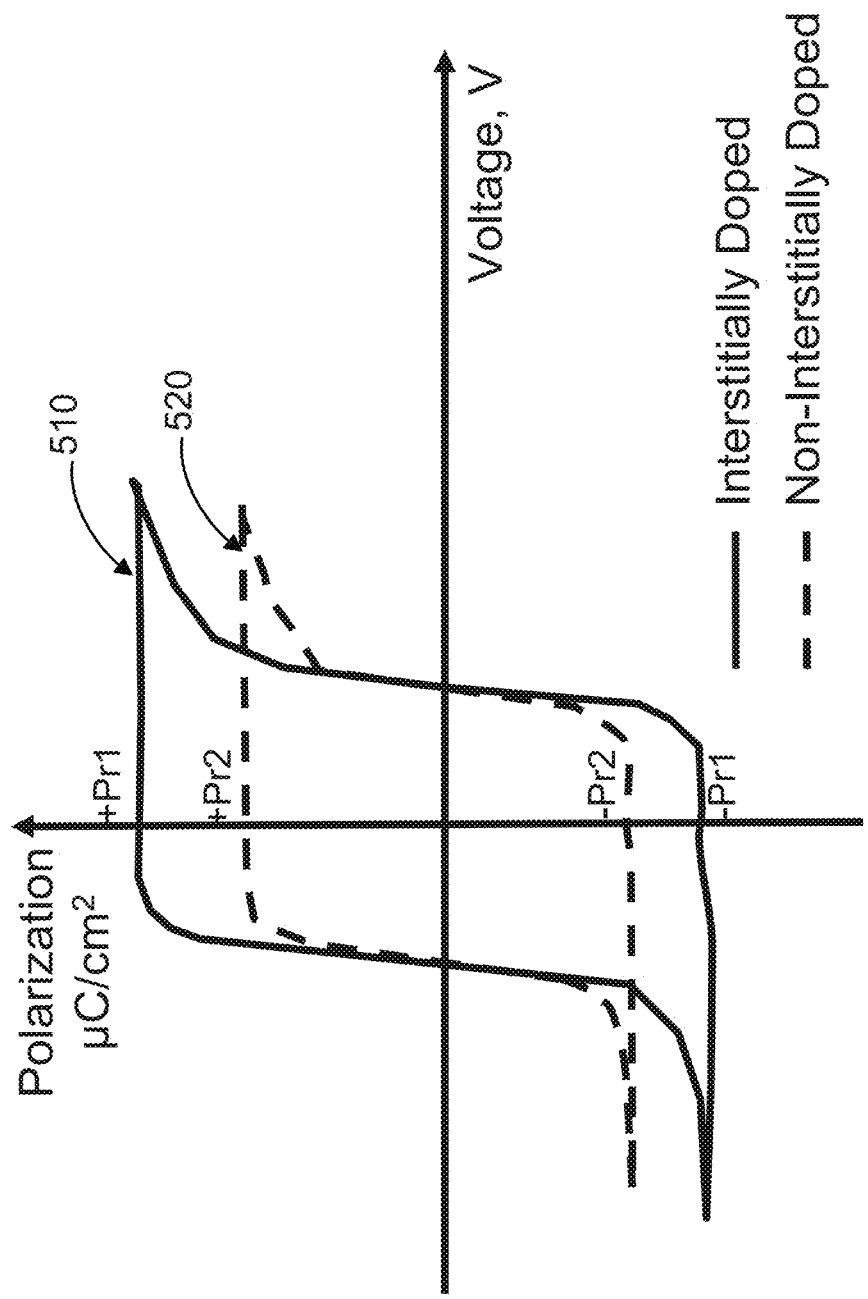
FIG. 5 is a diagram illustrating hysteresis loops of example ferroelectric materials in accordance with some embodiments of the present disclosure.

FIG. 5 is a diagram illustrating hysteresis loops 510 and 520 of example ferroelectric materials in accordance with some embodiments of the present disclosure. The hysteresis loops 510 and 520 correspond to an interstitially doped ferroelectric material and a non-interstitially doped ferroelectric material, respectively. For example, the interstitially doped ferroelectric material may be a $(Hf_{0.5}Zr_{0.5})O_2$ film doped with H, N, C, B, and/or F, etc. In this example, half of the Hf atoms on the metal sublattice are replaced by Zr atoms while the ratio of the metal atoms (the Hf atoms and the Zr atoms) to the oxygen atoms remains the same. The non-interstitially doped ferroelectric material may be a $Hf_{1-x}Zr_xO_2$ or $Al_{1-x}Sc_xN$ film doped with one or more dopants having an atomic radius that is comparable to the atomic radius of Hf and/or Zr, such as Y, Gd, Sr, Al, etc.

The hysteresis loop 510 shows the relationship between polarization of the interstitially doped ferroelectric material and the electric field applied to the interstitially doped ferroelectric material. As the applied electric field increases, the ferroelectric domains that are favorably oriented with respect to the external electric field may grow until total domain growth and reorientation of all the domains have occurred in a direction aligning with the external electric field. If the external electric field is removed at this point, the interstitially doped ferroelectric material is still polarized. The magnitude of remnant polarization at E=0 is referred to as remnant polarization and shown by ±Pr1 in the hysteresis loop 510. Each of the two polarization states ±Pr1 is stable and may be encoded as "1" or "0" to implement a memory device. Since no external electric field is required to maintain these states, the memory device is non-volatile. Large remnant polarization is preferable for non-volatile memory applications because a large remnant polarization may exhibit a wider memory window and an improved memory retention.

The hysteresis loop 520 shows the relationship between polarization of a non-interstitially doped ferroelectric material and the electric field applied to the substitutionally doped ferroelectric material. The remnant polarization of the substitutionally doped ferroelectric material is defined by ±Pr2 in the hysteresis loop 520. As shown in FIG. 5, Pr1 is greater than Pr2. The interstitially doped ferroelectric material exhibits larger remnant polarization than the non-interstitially doped ferroelectric material.

Figure 6:
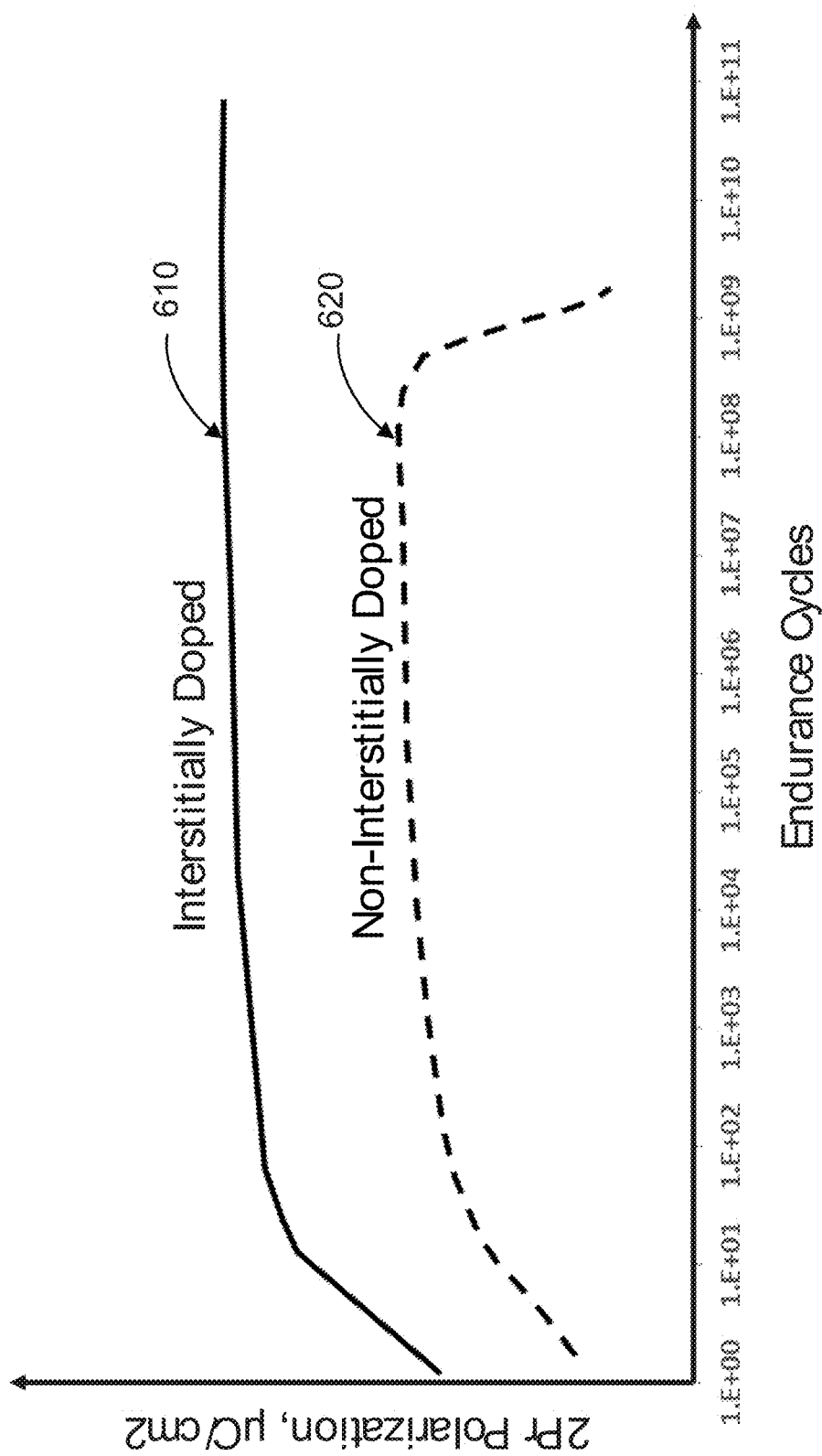
FIG. 6 is a diagram illustrating ferroelectric endurance of example ferroelectric materials in accordance with some embodiments of the present disclosure.

FIG. 6 is a diagram illustrating ferroelectric endurance of example ferroelectric materials in accordance with some embodiments of the present disclosure.

Curves 610 and 620 illustrate remnant polarization as a function of the number of switching cycles for an interstitially doped ferroelectric material and a non-interstitially doped ferroelectric material, respectively. As shown in curve 620, the non-interstitially doped ferroelectric material exhibits a polarization behavior in three stages, including an initial stage, a regular stage, and a fatigue stage. The initial stage (1 to 10 cycles) is also referred to as a wake-up stage, where the defects in the ferroelectric domains may be reduced with the cycling and the polarization may be improved with the cycling. The regular stage (10 to 1E+9 cycles) is the useful life stage where the polarizations of the ferroelectric material are almost consistent. The fatigue stage (after 1E+9 cycles) is the end-of-life state where the polarizations deteriorates with the cycling.

As shown in FIG. 6, the interstitially doped ferroelectric material exhibits higher ferroelectric polarization 2Pr (as shown in curve 610) as well as higher endurance. It exhibits an initial polarization state (1 to 10 cycles) and a regular polarization state (10 to 1E+11 cycles). It does not exhibit a fatigue stage when the test was ended at $10^{11}$ endurance cycles. Each endurance cycle corresponds to a hysteresis loop as described in connection with FIG. 4, including writing at +Pr, erasing at −Ec, writing at −Pr, and erasing at +Ec as shown in FIG. 4.

Figure 7:
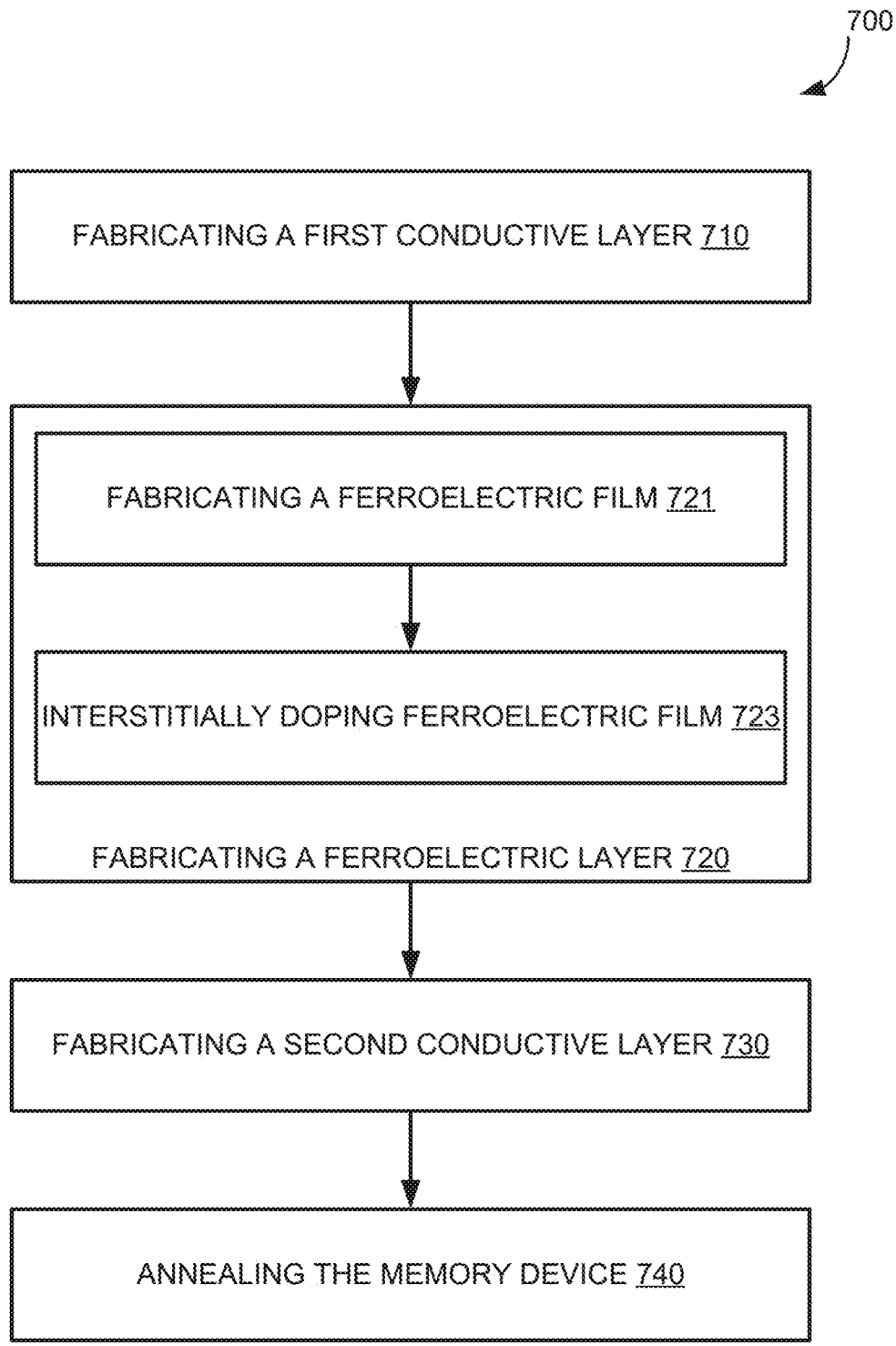
FIG. 7 is a flow chart illustrating an example process for fabricating a memory device in accordance with some embodiments of the present disclosure.

FIG. 7 is a flow chart illustrating an example process 700 for fabricating a memory device in accordance with some embodiments of the present disclosure.

At block 710, a first conductive layer may be fabricated. For example, a layer of a suitable electrically conductive material may be deposited utilizing atomic layer deposition (ALD), chemical vapor deposition (CVD), metal organic chemical vapor deposition (MOCVD), physical vapor deposition (PVD), molecular beam epitaxy (MBE) deposition, etc. The electrically conductive material may include, for example, W, Si, Ti, Ta, TiN, TaN, Pt, Pd, Ir, etc.

At block 720, a ferroelectric layer may be fabricated on the first conductive layer. The ferroelectric layer may include a ferroelectric material interstitially doped with at least one interstitial dopant. In some embodiments, the ferroelectric material may include a metal oxide. The interstitial dopant may include an element having an atomic radius that is not greater than an atomic radius of a metal element of the metal oxide. The metal oxide may include at least one of hafnium or zirconium. The interstitial dopant may include a nonmetal element, such as H, N, C, B, F, etc. The ferroelectric layer may be and/or include ferroelectric layer 120 as described in connection with FIG. 1 above.

At block 721, a ferroelectric film may be fabricated. Fabricating the ferroelectric film may involve, for example, depositing a layer of a ferroelectric material, such as $HfO_2$, $ZrO_2$, $Hf_{1-x}Zr_xO_2$, etc. Fabricating the ferroelectric film may involve fabricating a single-crystalline film of the ferroelectric material, a polycrystalline film of the ferroelectric material, and/or an amorphous film of the ferroelectric material with short-range order. The ferroelectric film may be fabricated utilizing ALD, CVD, MOCVD, MBE, PVD, and/or any other suitable deposition technique.

At block 723, the ferroelectric film may be interstitially doped. For example, the ferroelectric film may be doped by one or more interstitial dopants that may occupy the vacant space between the atoms of the ferroelectric material, such as H, N, C, B, F, etc. The interstitial dopants may be introduced into the ferroelectric film utilizing an ion implantation method, a co-sputtering method, an alternating sputtering method, a thermal diffusion method, a chemical absorption method, and/or any other suitable technique. In some embodiments, the dopant concentration of the interstitial dopant(s) may be about or less than 10%.

At block 730, a second conductive layer may be fabricated on the ferroelectric layer. For example, a layer of a suitable electrically conductive material may be deposited utilizing suitable deposition techniques, such as ALD, CVD, MOCVD, PVD, MBE, etc.

At block 740, the memory device may be annealed. For example, the first conductive layer, the ferroelectric layer, and/or the second conductive layer may be heated and may then be cooled down. More particularly, for example, the memory device may be annealed for crystallization of the t-$HfO_2$ phase and may then be quickly cooled down to form the ferroelectric o-$HfO_2$ phase. The interstitially doped $HfO_2$, $ZrO_2$, $Hf_{1-x}Zr_xO_2$, etc. may enhance the formation of the ferroelectric phases with thermodynamic and kinetic factors and may also reduce the domain sizes of the ferroelectric films.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events.

The terms "approximately," "about," and "substantially" may be used to mean within ±20% of a target dimension in some embodiments, within ±10% of a target dimension in some embodiments, within ±5% of a target dimension in some embodiments, and yet within ±2% in some embodiments. The terms "approximately" and "about" may include the target dimension.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. A memory device, comprising:
   a ferroelectric layer comprising a ferroelectric material interstitially doped with at least one interstitial dopant, wherein the ferroelectric material comprises a metal oxide, wherein the interstitial dopant comprises an element having an atomic radius that is not greater than an atomic radius of a metal element of the metal oxide, and wherein the interstitial dopant occupies existing empty spaces between atoms of the metal oxide, wherein the metal oxide comprises at least one of hafnium oxide ($HfO_2$), zirconium oxide ($ZrO_2$), zirconium-doped hafnium oxide ($Hf_{1-x}Zr_xO_2$), scandium-doped aluminum nitride ($Al_{1-x}Sc_xN$), titanates ($BaTiO_3$), niobates ($LiNbO_3$), or tantalates ($NaTaO_3$), and wherein the interstitial dopant comprises at least one of H, N, C, B, or F.

2. The memory device of claim 1, wherein a dopant concentration of the interstitial dopant is not greater than 10 percent.

3. The memory device of claim 1, wherein the ferroelectric layer comprises a monocrystalline film of the ferroelectric material.

4. The memory device of claim 1, wherein the ferroelectric layer comprises a polycrystalline film of the ferroelectric material.

5. The memory device of claim 4, wherein the ferroelectric layer comprises a plurality of ferroelectric domains, wherein each of the plurality of ferroelectric domains exhibits two polarization states.

6. The memory device of claim 5, wherein a dimension of the ferroelectric layer is not greater than 300 nm.

7. The memory device of claim 1, further comprising a conductive layer of an electrically conductive material fabricated on either side of the ferroelectric material.

8. The memory device of claim 1, wherein the memory device comprises a ferroelectric random-access memory (Fe-RAM).

9. The memory device of claim 1, wherein the memory device is non-volatile.

10. A method for fabricating a memory device, comprising:
    fabricating a ferroelectric film of a ferroelectric material; and
    interstitially doping the ferroelectric film with at least one interstitial dopant, wherein the ferroelectric material comprises a metal oxide, and wherein the interstitial dopant comprises an element having an atomic radius that is not greater than an atomic radius of a metal element of the metal oxide, wherein the metal oxide comprises at least one of hafnium oxide ($HfO_2$), zirconium oxide ($ZrO_2$), zirconium-doped hafnium oxide ($Hf_{1-x}Zr_xO_2$), scandium-doped aluminum nitride ($Al_{1-x}Sc_xN$), titanates ($BaTiO_3$), niobates ($LiNbO_3$), or tantalates ($NaTaO_3$), and wherein the interstitial dopant comprises at least one of H, N, C, B, or F.

11. The method of claim 10, wherein a dopant concentration of the interstitial dopant is not greater than 10 percent.

12. The method of claim 10, wherein fabricating the ferroelectric film of the ferroelectric material comprises fabricating a monocrystalline film of the ferroelectric material.

13. The method of claim 10, wherein fabricating the ferroelectric film of the ferroelectric material comprises fabricating a polycrystalline film of the ferroelectric material or an amorphous film of the ferroelectric material with short-range order.

14. The method of claim 10, wherein the ferroelectric film is fabricated utilizing at least one of an atomic layer deposition (ALD) technique, a chemical vapor deposition (CVD) technique, a metal organic chemical vapor deposition (MOCVD) technique, a physical vapor deposition (PVD) technique, or a molecular beam epitaxy (MBE) deposition technique.

15. The method of claim 10, wherein the ferroelectric film is interstitially doped using at least one of an ion implantation method, a co-sputtering method, a thermal diffusion method, an alternating sputtering method, or a chemical absorption method.

16. The method of claim 10, further comprising fabricating one or more conductive layers comprising an electrically conductive material on either side of the ferroelectric film, wherein the electrically conductive material comprises at least one of W, Si, Ti, Ta, TiN, TaN, Pt, Pd, or Ir.

17. The method of claim 16, further comprising annealing the ferroelectric film and the one or more conductive layers.

* * * * *